United States Patent
Tokuri et al.

(10) Patent No.: US 7,311,781 B2
(45) Date of Patent: Dec. 25, 2007

(54) SUBSTRATE ROTATION TYPE TREATMENT APPARATUS

(75) Inventors: Kentaro Tokuri, Kyoto (JP); Kenya Morinishi, Kyoto (JP); Masaki Iwami, Kyoto (JP)

(73) Assignee: Dainippon Screen MGF, Co., Ltd, Kyoto (JP)

( * ) Notice: Subject to any disclaimer, the term of this patent is extended or adjusted under 35 U.S.C. 154(b) by 0 days.

(21) Appl. No.: 11/256,976

(22) Filed: Oct. 25, 2005

(65) Prior Publication Data

US 2006/0102069 A1    May 18, 2006

(30) Foreign Application Priority Data

Nov. 17, 2004   (JP)   .............................. 2004-332624
Nov. 17, 2004   (JP)   .............................. 2004-332625

(51) Int. Cl.
   *B05B 15/04* (2006.01)
   *B05C 11/02* (2006.01)
(52) U.S. Cl. .................. 118/326; 118/52; 118/320; 134/153; 134/198
(58) Field of Classification Search .......... 118/52, 118/612, 319, 320, 326, DIG. 7; 134/198, 134/153, 902
   See application file for complete search history.

(56) References Cited

FOREIGN PATENT DOCUMENTS

| | | | |
|---|---|---|---|
| JP | 07116870 A | * | 5/1995 |
| JP | 10-258249 A | | 9/1998 |
| JP | 2004356299 A | * | 12/2004 |

OTHER PUBLICATIONS

English Translated Abstract and Detailed Description of JP-2004-356299.*
English Translated Detailed Description of JP10-258249.*
English Translated Abstract of JP07-116870.*

* cited by examiner

*Primary Examiner*—Yewebdar Tadesse
(74) *Attorney, Agent, or Firm*—McDermott Will & Emery LLP

(57) ABSTRACT

An apparatus causes a substrate to rotate and supplies a treatment liquid to a substrate surface to make a treatment, without concern that a mixed substance is eluted from a cup in the use for a long time, or a thin film comes off from an inside wall surface to be contamination-causing substances even if the cup made of a water-repellent material for collecting a treatment liquid becomes hydrophilic. A cup 16 disposed to surround the sides and underside of a substrate W rotating while being held by a spin chuck 10, and serving to collect a treatment liquid diffused from the substrate to the surroundings, is made of a plastic material. Further, an inside wall surface of an upper-side cup part 24 of the cup 16, being a portion on which the treatment liquid having been diffused from the substrate impinges, is roughened to be a hydrophilic surface.

4 Claims, 3 Drawing Sheets

SUBSTRATE ROTATION TYPE TREATMENT APPARATUS

BACKGROUND OF THE INVENTION

1. Field of the Invention

The present invention relates to a substrate rotation type treatment apparatus that holds substrates such as semiconductor wafers, liquid crystal display glass substrates, photomask glass substrates, optical disk substrates in a horizontal posture to cause the substrates to rotate about a vertical axis, and supplies to the substrate surface treatment liquids such as cleaning fluids, coating solutions, and developers to make the substrate treatment such as cleaning, coating, and development.

2. Description of the Related Art

When substrates such as semiconductor wafers are held in a horizontal posture with a spin chuck to be brought in rotation about a vertical axis, and a treatment liquid, for example, a cleaning fluid, e.g., pure water is supplied to the substrate surface to make the cleaning treatment of the substrates, the cleaning fluid having been supplied on the substrate surface spreads to the substrate edge due to a centrifugal force, and the cleaning fluid having been used is diffused from the substrate edge to the surroundings. There is provided around a substrate, which is held by a spin chuck, a cup so as to surround the sides and the under side of the substrate. The used cleaning fluid having been diffused from the substrate to the surroundings impinges on the inside wall surface of a cup to be collected, flows down on the cup inside wall surface to be collected at the cup bottom, and is discharged from a drain, which is provided in the cup bottom, through a drain pipe to be recycled.

A cup for collecting a treatment liquid having been diffused from a substrate to the surroundings has been conventionally made of plastic materials such as fluororesin, e.g., polytetrafluoroethylene (PTFE), polyvinylchloride (PVC), and polypropylene (PP), or metal materials such as stainless steel. At present, however, most cups are made of resin. A main function of this cup is to prevent a treatment liquid having been diffused from the substrate to the surroundings from being diffused also to the outside of the substrate treatment section, as well as to collect the treatment liquid to cause it to flow to a drain in the cup bottom. Nevertheless, a plastic material, especially, fluororesin that forms a cup is water-repellent (hydrophobic), and an inside wall surface of the cup will be repellent to a hydrophilic treatment liquid such as cleaning fluid, e.g., pure water when the treatment liquid impinges thereon.

FIGS. 4-A and 4-B are schematic diagrams showing the schematic construction of substrate rotation type treatment apparatuses. In the drawings, reference numeral 1 designates a spin chuck that holds a substrate W in a horizontal posture. Numeral 2 designates a rotary shaft that supports the spin chuck 1 holding a substrate W to cause it to rotate about a vertical axis. Numeral 3 designates a cup that collects a treatment liquid. Numeral 4 designates a drain portion that discharges the treatment liquid, and recycles it. When the cups 3 is made of a hydrophilic material, as shown in FIG. 4-B, a hydrophilic treatment liquid having been diffused from the surface of a substrate W to the surroundings to impinge on the inside wall surface of the cup 3 spreads forming a thin film on the inside wall surface to flow down to the bottom of the cup 3, and is discharged through the drain portion 4. In contrast, when the cup 3 is made of a water-repellent material, as shown in FIG. 4-A, a treatment liquid having been diffused from the surface of a substrate W to the surroundings to impinge on the inside wall surface of the cup 3 is splashed on the inside wall surface, and a part of it will adhere to the surface of a substrate W again. At this time, a problem arises in that when a treatment liquid such as used cleaning fluid contains impurities, the impurities in the treatment liquid becomes particles to be contamination-causing substances of a substrate W. Moreover, a further problem arises in that when a treatment liquid adheres to the inside wall surface of the cup 3 to be dried, and treatment liquid constituents are accumulated during the treatment of a number of substrates, the accumulated constituents become particles to adhere to the surface of a substrate W along with the treatment liquid having been splashed on the inside wall surface to be contamination-causing substances.

To overcome this problem, it has been carried out that a cup made of a water-repellent material is made hydrophilic. Several methods of making hydrophilic include, for example, as disclosed in the Japanese Patent Publication (unexamined) No. 258249/1998, a method that material properties itself is improved to be hydrophilic by mixing a substance for making hydrophilic into resin material at the time of making a cup of a plastic material by molding, or another method that the inside wall surface of a cup is made hydrophilic by a hydrophilic material being deposited on the inside wall surface of a cup forming a thin film.

However, in a cup which material properties itself is improved to be hydrophilic by mixing a substance into resin material, a problem still exists in that the mixed substances will be eluted in the use of a long time period to become contamination-causing substances of a substrate. Moreover, in a cup on the inside wall surface of which a hydrophilic material is deposited forming a thin film, a problem exists in that the thin film of hydrophilic material comes off from the inside wall surface in the use of a long time period to become contamination-causing substances of a substrate.

SUMMARY OF THE INVENTION

The present invention was made in view of the problems as describe above, and has an object of providing a substrate rotation type treatment apparatus without any concern that a mixed substance is eluted from a cup in the use of a long time period, or a thin film comes off from an inside wall surface to be contamination-causing substances even if a cup made of a water-repellent material is made hydrophilic.

A first embodiment of the invention is a substrate rotation type treatment apparatus causing a substrate to rotate to make substrate treatment, includes:

substrate holding means for holding the substrate in a horizontal posture;

substrate rotation means for causing the substrate that is held by the mentioned substrate holding means to rotate about a vertical axis;

treatment liquid supply means for supplying a treatment liquid to a surface of the substrate held by the mentioned substrate holding means; and a cup having a container shape of which top is open, and which is disposed so as to surround the sides and the under side of the substrate held by the mentioned substrate holding means, and which serves to collect a treatment liquid to be diffused from the substrate to the surroundings;

in which the mentioned cup is made of a plastic material, and at least a portion of an inside wall surface of this cup on which a treatment liquid having been diffused from the substrate to the surroundings impinges is roughened to be a hydrophilic surface.

A second embodiment of the invention is the substrate rotation type treatment apparatus according the first embodiment of the invention characterized in that the inside wall surface of the mentioned cup is roughened so that a contact angle is not more than 10°.

A third embodiment of the invention is the substrate rotation type treatment apparatus according to the first or second embodiment of the invention characterized in that there are mixed hydrophilic surface and hydrophobic surface at least at the portion of the inside wall surface of the mentioned cup on which a treatment liquid having been diffused from the surface to the surroundings impinges.

A fourth embodiment of the invention is the substrate rotation type treatment apparatus according to the third embodiment of the invention characterized in that there are mixed hydrophilic surface and hydrophobic surface in a striped pattern extending horizontally.

A fifth embodiment of the invention is the substrate rotation type treatment apparatus according to the third embodiment of the invention characterized in that there are mixed hydrophilic surface and hydrophobic surface in a checkered pattern.

In the substrate rotation type treatment apparatus of the invention according to the first embodiment of the invention, the inside wall surface of a cup is made to be a hydrophilic surface, so that a treatment liquid having been diffused from a substrate to the surroundings to impinge on the inside wall surface of the cup spreads forming a thin film on the inside wall surface to flow down to the bottom of the cup to be drained. Therefore, it is possible to prevent a treatment liquid having bee diffused from the substrate from being splashed on the inside wall surface of the cup to adhere to a surface of the substrate again resulting in the contamination of the substrate.

Furthermore, in the substrate rotation type treatment apparatus of the invention according to the first embodiment of the invention, the inside wall surface of a cup is made to be a hydrophilic surface by roughening, so that there is no worry at all that mixed substance is eluted from the cup in the use of a long time period, or a thin film comes off from an inside wall surface to be contamination-causing substances.

In the substrate rotation type treatment apparatus of the invention according the second embodiment of the invention, any hydrophilic treatment liquid is not splashed at all on the inside wall surface of a cup, and the treatment liquid having been diffused from the substrate to impinge on the inside wall surface of the cup spreads in the thinner film condition on the inside wall surface, and flows down to the bottom of the cup to be drained.

In the substrate rotation type treatment apparatus of the invention according to the third or fifth embodiments of the invention, as compared with a cup in which an overall portion of the inside wall surface of a cup on which a treatment liquid having been diffused from the surface to the surroundings impinges is a hydrophobic surface, splashing of the hydrophilic treatment liquid is decreased, as well as a treatment liquid having impinged on the hydrophobic surface to be diffused on the surface rapidly flows to the adjacent hydrophilic surface to aggregate on the hydrophilic surface, so that splashing of a treatment liquid is unlikely to occur. Originally splashing of the treatment liquid impinged on the hydrophobic surface does not easily take place in itself. Thus, it is prevented that a treatment liquid having been diffused from the surface to impinge on the inside wall surface of a cup is splashed on the inside wall surface, and that a part of the used treatment liquid adheres to a surface of the substrate. On the other hand, when a treatment liquid having impinged on a hydrophilic surface to spread forming a thin film, or having flowed from a hydrophobic surface to a hydrophilic surface to aggregate, grows up to a certain size of droplets, it flows down from the hydrophilic surface to the adjacent hydrophobic surface, so that a time period of a treatment liquid being retained on the hydrophilic surfaces comes to be shorter. Consequently, it is prevented that a treatment liquid adheres to the inside wall surface of a cup to be dried, and that impurities or treatment liquid constituents are accumulated on the inside wall surface of the cup.

As described above, with the use of a substrate rotation type treatment apparatus according to the third or fifth embodiments of the invention, it is prevented that a treatment liquid having been diffused from the surface of a rotating substrate is splashed on the inside wall surface of a cup, as well as that a treatment liquid adheres to the inside wall surface of the cup to be dried, and that impurities or treatment liquid constituents are accumulated on the cup inside wall surface. As a result, it is possible to eliminate the causes of substrate contamination resulted from the cup.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4-B is a schematic diagram showing a schematic construction of the substrate rotation type treatment apparatus to explain the situation in which a hydrophilic treatment liquid having been diffused from the surface of a substrate to the surroundings impinges on the hydrophilic cup inside wall surface.

DESCRIPTION OF THE PREFERRED EMBODIMENTS

Several preferred embodiments according to the present invention are hereinafter described referring to FIG. 1.

Figure 1:
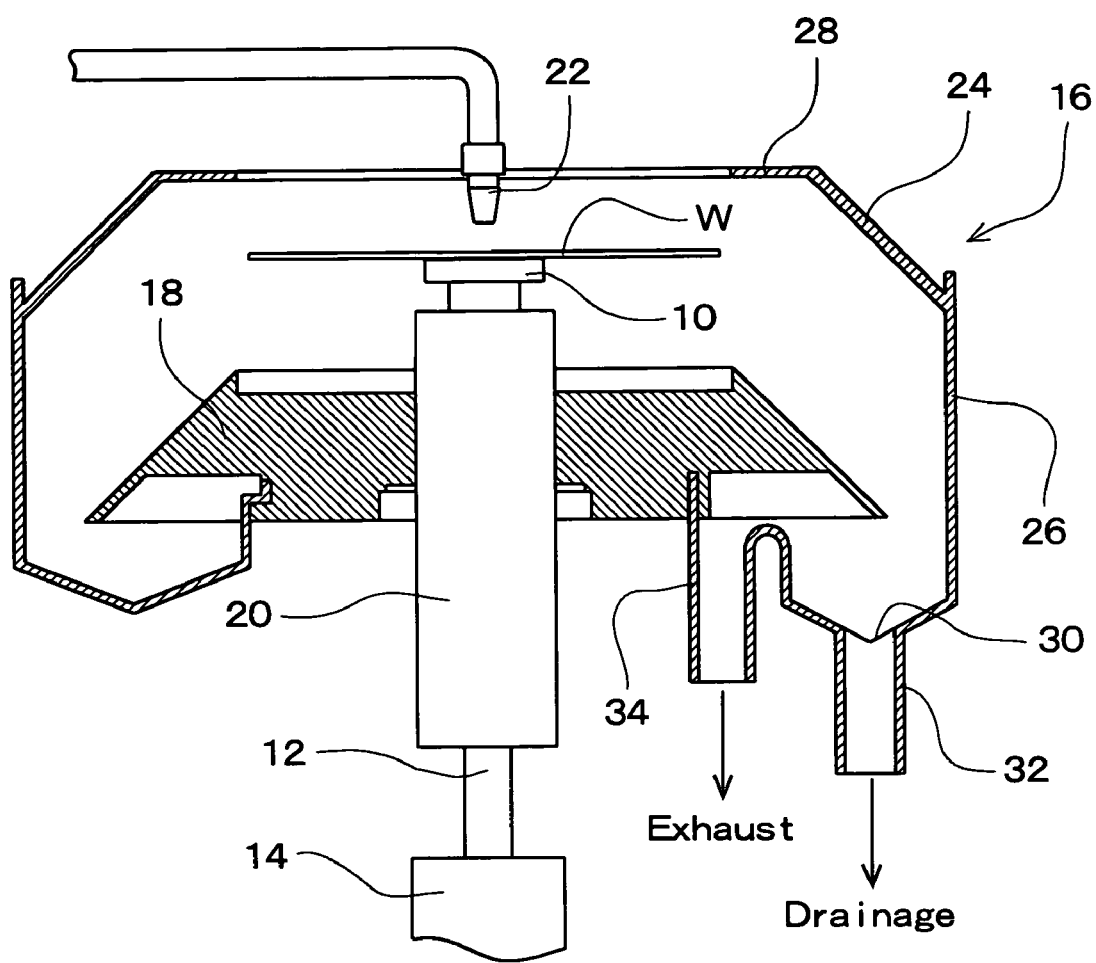
FIG. 1 shows one example of preferred embodiments according to the present invention, and is a longitudinal section showing a schematic construction of an essential part of a substrate rotary cleaning apparatus, being a substrate rotation type treatment apparatus.

FIG. 1 shows one example of preferred embodiments according to the invention, and is a longitudinal section showing a schematic construction of an essential part of a substrate rotation type treatment apparatus, for example, a substrate rotary cleaning apparatus (spin scrubber).

This cleaning apparatus includes a spin chuck 10 that holds a substrate W such as semiconductor wafers in a horizontal posture. The substrate W, which is held by the spin chuck 10, is made to rotate in a horizontal plane about a vertical axis by a spin motor 14 that is connected to a rotary shaft 12 supporting the spin chuck 10. There is provided around the substrate W a cup 16 that is formed in a container shape which top is open, and which surrounds the sides and the under side of the substrate W held by the spin chuck 10. There is provided a baffle member 18 of a truncated cone shape under the substrate W that is held by the spin chuck 10 in an internal part of the cup 16. A support cylinder 20 is integrally fixed to the central portion of the baffle member 18. Further, a rotary shaft 12 is inserted through in a internal part of the support cylinder 20. The cup 16 and the baffle member 18 are connected as an integral whole so that a bottom wall of the cup 16 is bended to come around the bottom face of the baffle member 18. The support cylinder 20 and the rotary shaft 12 are not connected together. Thus, the cup 16, the baffle member 18 and the support cylinder 20 can move upward and downward as an integral whole with respect to the spin chuck 10, the rotary shaft 12 and the spin motor 14, and are arranged to move up and down between the position at the time of substrate cleaning as shown and the lower position at the time of carrying the substrate in and out by a hoisting and lowering mechanism, not shown.

There is disposed a cleaning fluid supply nozzle 22 that supplies a cleaning fluid such as pure water onto the surface of a substrate W above the substrate W held by the spin chuck 10. The cleaning supply nozzle 22 can be restored outside the cup 16 from the position as shown. Moreover, although not shown, there is provided a rotary cleaning brush that makes a scrub cleaning while scanning the surface of the substrate W above the substrate W held by the spin chuck 10, and this rotary cleaning brush is supported so as to be capable of moving upward and downward.

The cup 16 comprises an upper-side cup part 24 of which perimeter is formed in a truncated cone shape, and of which inside wall is broadened downward, a lower-side cup part 26 that is connected to the lower end of this upper-side cup part 24 to be formed in a cylindrical shape and includes a bottom wall bended so as to come around the bottom face of the baffle member 18, and an annular part 28 that is connected to the upper end of the upper-side cup 24 to horizontally overhang inward from this upper end. These parts form an integral whole of a container shape. The upper-side cup part 24 is disposed at the height including a horizontal plane where a substrate W held by the spin chuck 10 is positioned at the time of substrate cleaning, and a cleaning fluid having been diffused from the surface of the substrate W to the surroundings impinges on an inside wall surface of the upper-side cup part 24. There is formed a drain 30 in the bottom wall of the lower-side cup part 26, and a drainpipe 32 is connected to the drain 30. Furthermore, there is provided an air release pipe 34 open at a position opposite to the lower face of the baffle member 18, and the discharge of air in the cup 16 is performed through this air release pipe 34.

The cup 16 constructed described above is made of a plastic material such as fluororesin, e.g., PTFE, polyvinyl chloride or polypropylene. Further, at least the upper-side cup part 24 of the cup 16, that is the whole or a part of the inside wall surface of the upper-side cup part 24, being a portion on which a cleaning fluid having been diffused from the surface of a substrate W to the surroundings, impinges is roughened uniformly, whereby an inside wall surface of the upper-side cup part 24 becomes a hydrophilic surface. Preferably, the inside wall surface of the upper-side cup part 24 is roughened so as to be a hydrophilic surface having a contact angle of not more than 10°. The methods of roughening include, for example, physically roughening an inside wall surface using, e.g., extremely smooth-cut file; plasma treatment, i.e., using a nozzle having a plasma generating part at the tip, and scanning an inside wall surface with this nozzle tip to roughen the inside wall surface; or using a chemical agent, and applying this chemical agent to an inside wall surface to roughen the inside wall surface. However, the roughening method may be any one of the conventional methods. In addition, a part or the whole of an inside wall surface of the lower-side cup pat 26 other than the upper-side cup part 24 may be roughened to form a hydrophilic surface.

In this substrate rotary cleaning apparatus, since an inside wall surface of the upper-side cup part 24 of the cup 16 is roughened to be a hydrophilic surface, at the time of substrate cleaning, a used cleaning fluid such as pure water having been diffused from the surface of a rotating substrate W to the surroundings due to the centrifugal force impinges on the inside wall surface of the upper-side cup part 24 of the cup 16, spreads forming a thin film on the inside wall surface without being flashed, and flows down to the lower-side cup part 26. Then, the cleaning fluid rapidly flows down on the inside wall surface of the lower-side cup part 26, being a hydrophobic surface to be collected at the inner bottom, flows from the inner bottom of the lower-side cup part 26 toward the drain 30, and is discharged outside the cup 16 from the drain 30 through the drain pipe 32 to be recycled. In this manner, a cleaning fluid having been diffused from the substrate W is prevented from impinging on the inside wall surface of the cup 16 and adhering to a surface of the substrate W again, resulting in the contamination of a substrate.

An experiment using the substrate rotary cleaning apparatus was carried out to compare degrees of splashing of a cleaning fluid (pure water) from the cup inside wall surface between a PVC cup (inside diameter: 400 mm) of which inside wall surface is not roughened yet by plasma treatment, and that of which inside wall surface has been roughened. When a wafer (diameter: 300 mm) was rotated at a speed of 1000 rpm and was dripped with back-rinse at the flow rate of 300 ml/min at the central portion thereof, the number of water droplets of a size of not less than 12 μm that were adherent to a wafer surface due to splashing of pure water on the cup inside wall surface was counted. As are result, while the number of water droplets before plasma treatment of the inside wall surface of a cup was 1000, it was 10 after the plasma treatment. From this result, it was actually acknowledged that splashing of a cleaning fluid from the inside wall surface of a cup is significantly decreased by the inside wall surface of a cup made of PVC being plasma-treated to be roughened.

In the case where the whole or a part of the inside wall surface of the upper-side cup part 24 is roughened to be a hydrophilic surface, it is preferable that the whole or a part of the inside wall surface of the upper-side cup part 24 is made to be uniformly a hydrophilic surface, or to be mixed hydrophilic surfaces and hydrophobic surfaces. For example, as a development view of an inside wall surface of the upper-side cup part shown in FIG. 2, it is preferable that an inside wall surface of the upper-side cup part 24a is roughened so that there are mixed hydrophilic surfaces 36 and hydrophobic surfaces 38 in a horizontally extending striped pattern. In addition, as a development view of an inside wall surface of the upper-side cup part shown in FIG. 3, it is preferable that an inside wall surface of the upper-side cup part 24 is roughened so that there are mixed hydrophilic surfaces 42 and hydrophobic surfaces 44 in a checkered pattern. Furthermore, it is preferable to be in the other forms, for example, in a scaled pattern of the combination of triangles, or in a honeycomb pattern of the combination of hexagons.

Figure 2:
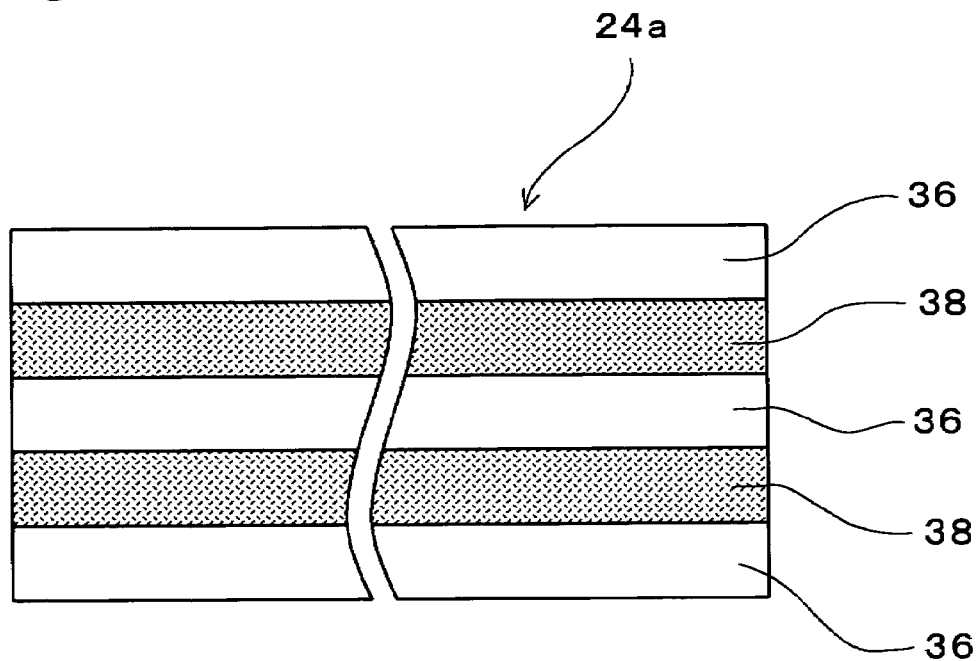
FIG. 2 shows another embodiment of the invention, and is a view showing in a developed state an upper cup part of a cup, being a component of the substrate rotary cleaning apparatus.
Figure 3:
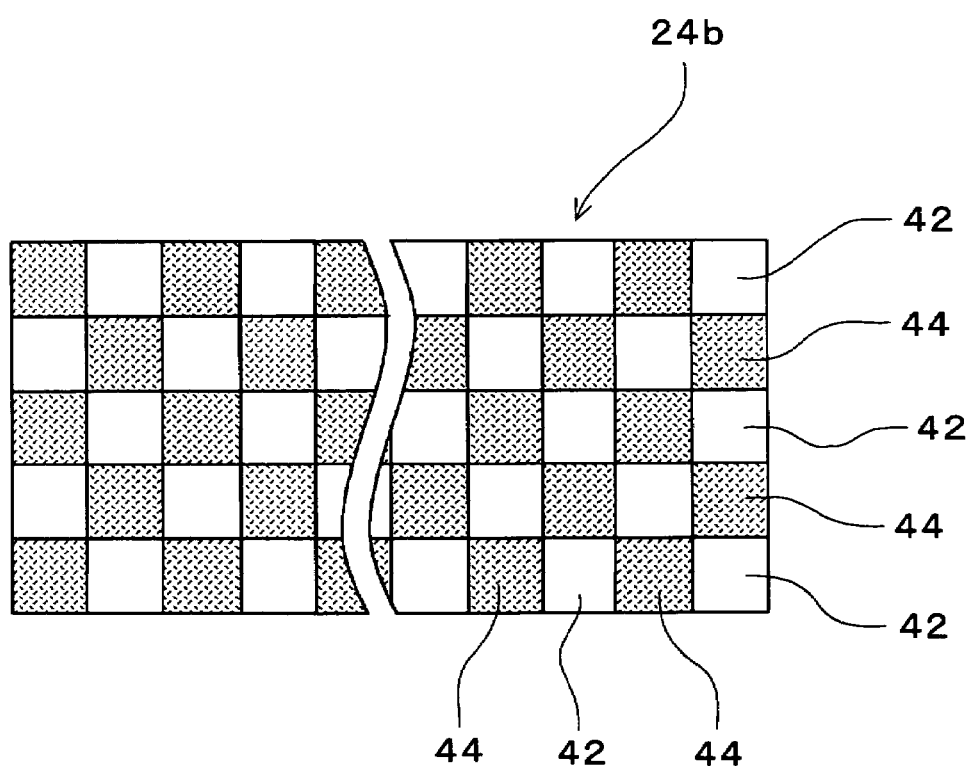
FIG. 3 shows a further embodiment of the invention, and is a view showing in a developed state an upper cup part of a cup, being a component of the substrate rotary cleaning apparatus.
Figure 4A:
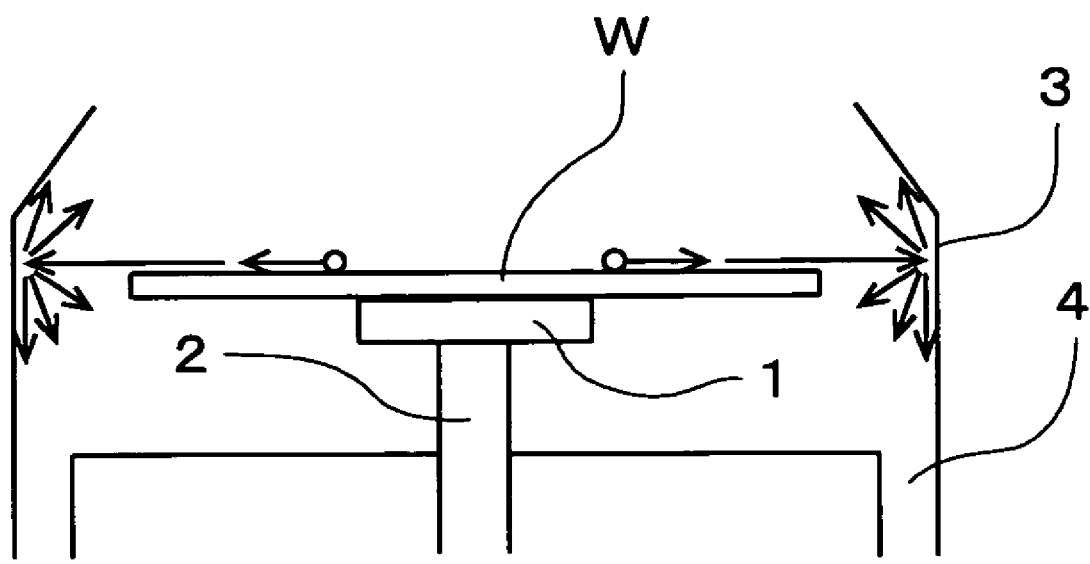
FIG. 4-A is a schematic view showing a schematic construction of the substrate rotation type treatment apparatus to explain the situation in which a hydrophilic treatment liquid having been diffused from the surface of a substrate to the surroundings impinges on the water-repellent cup inside wall surface.
Figure 4B:
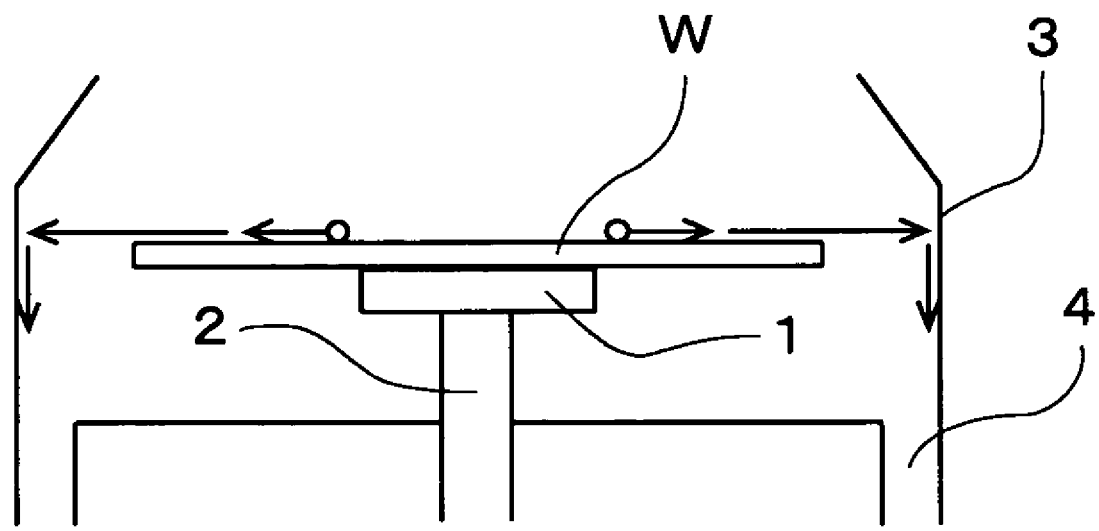

As shown in FIG. 2 and FIG. 3, when there are mixed hydrophilic surfaces 36, 42 and hydrophobic surfaces 38, 44 on the inside wall surface of the upper-side cup parts 24a, 24b, since a cleaning fluid having impinged on the hydrophobic surfaces 38, 44 of the inside wall surface of the upper-side cup parts 24a, 24b to be diffused on the surface rapidly flows to the adjacent hydrophilic surfaces 36, 42 above and below to aggregate on the hydrophilic surfaces 36, 42, splashing of a cleaning fluid is unlikely to occur. Further, a cleaning fluid having impinged on the hydrophilic surfaces 36, 42 on the inside wall surface of the upper-side cup parts 24a, 24b spreads forming a thin film, so that originally splashing is unlikely to occur. Accordingly, a cleaning fluid having been diffused from a substrate W to impinge on the inside wall surface of the upper-side cup parts 24a, 24b is not splashed on the inside wall surface to prevent a part of used cleaning fluid from adhering to a surface of the substrate W again. Thus, there will be no fear of impurities that are contained in the used cleaning fluid coming to be particles to contaminate the substrate W.

On the other hand, when a cleaning fluid having impinged on the hydrophilic surfaces 36, 42 on the inside wall surface of the upper-side cup parts 24a, 24b to spread forming a thin film, or having flowed from the hydrophobic surfaces 28, 44 to the hydrophilic surfaces 36, 42 to aggregate grows up to a droplet of a certain size, it flows down from the hydrophilic surfaces 36, 42 to the hydrophobic surfaces 38, 44 adjacent to the lower side thereof, so that a time period of being retained on the hydrophilic surfaces 36, 42 becomes shorter. Accordingly, it is prevented that a cleaning fluid adheres to the inside wall surface of the upper-side cup parts 24a, 24b to be dried, and that impurities in the used cleaning fluid are accumulated on the inside wall surface of the upper-side cup parts 24a, 24b.

According to the above-mentioned embodiments, the case where this invention is applied to a substrate rotary cleaning apparatus is described. However, the invention may be likewise applied to the other substrate rotation type treatment apparatuses, for example, developers (spin developer), or coaters (spin coater). It is preferable to apply this invention in order to cause the inside wall surface of a cup that is made of a hydrophilic material to be more hydrophilic (making contact angles still smaller). Furthermore, the structure of a cup is not limited to that described in the above-mentioned embodiment.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A substrate rotation type treatment apparatus causing a substrate to rotate to make substrate treatment comprising:
    substrate holding means for holding the substrate in a horizontal posture;
    substrate rotation means for causing the substrate that is held by said substrate holding means to rotate about a vertical axis;
    treatment liquid supply means for supplying a treatment liquid to a surface of the substrate held by said substrate holding means; and
    a cup having a container shape of which top is open, which is disposed so as to surround the sides and the under side of the substrate held by said substrate holding means, and which serves to collect a treatment liquid to be diffused from the substrate to the surroundings;
    wherein said cup is made of polyvinyl chloride, and at least a portion of an inside wall surface of said cup on which a treatment liquid having been diffused from the substrate to the surroundings impinges is roughened to be a hydrophilic surface by plasma treatment so that a contact angle is not more than 10°.

2. A substrate rotation type treatment apparatus causing a substrate to rotate to make substrate treatment comprising:
    substrate holding means for holding the substrate in a horizontal posture;
    substrate rotation means for causing the substrate that is held by said substrate holding means to rotate about a vertical axis;
    treatment liquid supply means for supplying a treatment liquid to a surface of the substrate held by said substrate holding means; and
    a cup having a container shape of which top is open, which is disposed so as to surround the sides and the under side of the substrate held by said substrate holding means, and which serves to collect a treatment liquid to be diffused from the substrate to the surroundings;
    wherein said cup is made of a plastic material, and at least a portion of an inside wall surface of said cup on which a treatment liquid having been diffused from the substrate to the surroundings impinges is roughened to be a hydrophilic surface; and wherein there are mixed hydrophilic surface and hydrophobic surface at least at the portion of the inside wall surface of said cup on which a treatment liquid having been diffused from the surface to the surroundings impinges.

3. The substrate rotation type treatment apparatus according to claim 2, wherein there are mixed hydrophilic surface and hydrophobic surface in a striped pattern horizontally extended.

4. The substrate rotation type treatment apparatus according to claim 2, wherein there are mixed hydrophilic surface and hydrophobic surface in a checkered pattern.

* * * * *